United States Patent [19]

Hu

[11] Patent Number: 5,863,393
[45] Date of Patent: Jan. 26, 1999

[54] LOW ANGLE, LOW ENERGY PHYSICAL VAPOR DEPOSITION OF ALLOYS

[75] Inventor: Yongjun Hu, Boise, Id.

[73] Assignee: Micron Technology, Inc., Boise, Id.

[21] Appl. No.: 964,575

[22] Filed: Nov. 5, 1997

Related U.S. Application Data

[62] Division of Ser. No. 677,659, Jul. 8, 1996, Pat. No. 5,725,739.

[51] Int. Cl.$^6$ ..................................................... C23C 14/34
[52] U.S. Cl. .................................. 204/192.3; 204/192.12; 204/192.17; 438/658; 438/664; 438/683
[58] Field of Search ........................... 204/192.3, 192.12, 204/192.17; 438/658, 664, 683

[56] References Cited

U.S. PATENT DOCUMENTS

| | | | |
|---|---|---|---|
| 4,717,462 | 1/1988 | Homma et al. | 204/298.06 |
| 4,724,060 | 2/1988 | Sakata et al. | 204/298.11 |
| 4,824,544 | 4/1989 | Mikalesen et al. | 204/298.06 |
| 4,834,856 | 5/1989 | Wehner | 204/192.24 |
| 4,874,493 | 10/1989 | Pan | 204/192.11 |
| 4,983,547 | 1/1991 | Arima et al. | 437/246 |
| 5,114,556 | 5/1992 | Lamont, Jr. | 204/192.12 |
| 5,302,266 | 4/1994 | Grabarz et al. | 204/192.12 |
| 5,482,611 | 1/1996 | Helmer et al. | 204/298.17 |
| 5,486,492 | 1/1996 | Yamamoto et al. | 437/192 |
| 5,525,543 | 6/1996 | Chen | 437/190 |

OTHER PUBLICATIONS

Clarke, A., "Low–Angle Sidewall Planarization", *Semiconductor International*, vol. 18, No. 9, 1, (Aug., 1995).
Ogawa, S., et al., "Dependence of Thermal Stability of the Titanium Silicide/Silicon Structure on Impurities", *Applied Physics Letters*, vol. 56, No. 8, 725–727, (Feb. 19, 1990).
Wehner, G.K., "The Aspects of Sputtering in Surface Analysis Methods", *Methods of Surface Analysis*, Elsevier Scientific, vol. 1, 5–37, (1975).

*Primary Examiner*—Mark Chapman
*Attorney, Agent, or Firm*—Schwegman, Lundberg, Woessner & Kluth, P.A.

[57] ABSTRACT

An alloy or composite is deposited in a recess feature of a semiconductor substrate by sputtering an alloy or composite target into a recess, to form a first layer of deposited material. The first layer of deposited material is resputtered at a low angle and low energy, to redeposit the first layer of deposited material onto the bottom of the recess as a second layer of deposited material having a different stoichiometry than that of the first deposited material. In a further embodiment, a sputtering chamber ambient is comprised of argon and nitrogen. In yet a further embodiment, the resputtering step is followed by deposition of at least one layer of material with a different stoichiometry than that of the second deposited layer, to form a "graded" stoichiometry of material deposited in the recess.

5 Claims, 3 Drawing Sheets

LOW ANGLE, LOW ENERGY PHYSICAL VAPOR DEPOSITION OF ALLOYS

This application is a divisional of U.S. Ser. No. 08/677,659 filed Jul. 8, 1996, now U.S. Pat. 5,725,739.

TECHNICAL FIELD

This invention relates to methods and apparatus for manufacturing semiconductor devices, and, in particular, for depositing alloys at the bottom of high-aspect ratio contact holes.

BACKGROUND

In the fabrication of semiconductor integrated circuits (ICs), active device regions are formed in semiconductor substrates, isolated from adjacent devices. Specific electrical paths connect such active devices, using high-conductivity, thin-film structures. Such structures make contacts with active devices through openings, or contact holes, in the isolating material. Of primary concern is the formation of low-resistivity contacts, in order to ensure devices perform properly. As ICs are scaled down in size, so are the devices which make up the ICs. Increases in resistance are associated with increasing circuit density and adversely affect device performance. Ways to decrease the overall resistance of ICs, including contacts, are crucial to continued successful device performance.

One way in which circuit resistance is decreased is by creating low-resistance, ohmic contacts at the device level. Ohmic contacts exhibit nearly linear current-voltage characteristics in both directions of current flow. Various factors affect the type of contact which is maintained. Increasing dopant concentration in the semiconductor contact area decreases contact resistance, up to the solubility of the dopant at the temperature at which it is introduced. Unclean semiconductor surfaces (i.e., those which contain a native oxide film) increase contact resistance. Native oxides are a problem due to silicon's rapid oxidation rate when exposed to an oxygen ambient. The most widely used method for removal of such oxides is by dipping the wafer in a hydrofluoric acid solution. However, this does not provide perfect cleaning of the semiconductor substrate because some native oxide forms between the time of the hydrofluoric acid dip and the deposition of metal contacts. Sputter etching has been used in an attempt to alleviate this imperfection, but it falls short because more oxide is introduced onto the semiconductor substrate than is removed.

Conventional process steps for formation of ohmic contacts to semiconductor substrates include the following: formation of heavily doped regions where contacts are to be made, etching a contact hole in the isolating oxide layer which covers the semiconductor substrate, cleaning the semiconductor surface to remove native oxide, depositing a metal film over the wafer by physical vapor deposition (PVD), and annealing to improve the metal-to-semiconductor contact. During the metal deposition step, obtaining good bottom step coverage is very important in maintaining the overall ohmic contact. High-aspect ratio (ratio of height-to-opening of a contact hole) holes make it even more difficult to achieve good bottom step coverage. Such holes are much deeper than they are wide, preventing good bottom step coverage by the conventional process steps.

The type of film deposition has an effect on the resulting step coverage. Chemical vapor deposition (CVD) processes are more likely to fill high-aspect ratio holes than physical vapor deposition (PVD) processes. However, some films cannot be deposited using CVD, due to contamination introduced by CVD processes. CVD is often accompanied by a significant amount of carbon, chlorine, oxygen, and other contaminants that are detrimental to device performance. Forming films that are free from contamination is even more important as devices decrease in size. Defects resulting from such contamination are even more dominant in thinner films, which are present in smaller devices.

Different types of metal layers are used to improve ohmic contacts. The most commonly used metals are reacted with underlying silicon to form silicides. Titanium silicide is the most commonly used metal silicide due to its superior qualities, one being its ability to getter oxygen. Titanium silicide forms good ohmic contacts with both polysilicon and single-crystal silicon doped contact areas. Silicides, in general, are preferred for contact formation due to their ability to reduce native oxide remaining on semiconductor substrates. This reduction occurs because titanium reacts with native oxide to form titanium oxide and titanium silicide. The oxide layer remains on top of the silicide layer after annealing, separated from the underlying silicon.

As an effect of shrinking IC devices, device source/drain junction depths become shallower. When metals are deposited and then annealed to form a silicide, silicon is consumed from the shallow source/drain regions, to react with the metal to form a silicide. When shallow source/drain regions are depleted of silicon, they are more prone to junction leakage. Thus, consumption of silicon during annealing to form silicide must be as small as possible to prevent junction leakage. In general, for a particular thickness of deposited metal, a proportional thickness of silicon substrate is consumed, depending on the stoichiometry of the silicide formed. In particular, for a given thickness of deposited titanium, the amount of silicon consumed is approximately two times as thick, to form titanium silicide ($TiSi_2$).

A primary method for depositing films by PVD is sputtering. Sputtering is a method by which atoms on a target are displaced to a desired surface, where they form a thin film. One possible solution to the problem of over consumption of silicon in shallow junctions is to use a PVD process to deposit a metal/silicon alloy, like titanium silicide. When the deposited material is an alloy, the target is generally a composite target consisting of two or more materials mechanically arranged in a selected ratio, to yield a film of the desired alloy composition.

One of the major problems associated with obtaining good bottom step coverage utilizing PVD is material "overhang" at the "shoulder" (i.e., the corner of a sidewall and the top surface) of contact openings. This is a result of imperfect lines of incidence traveled by sputtered target atoms, because, in general, sputtered atoms travel following the law of cosines. Doming of the sputtered material commonly occurs in the bottom of the contact hole due to material overhang. This results in poor bottom corner step coverage, which often leads to contact failure.

Even with the use of collimated sputtering, techniques of collimating the sputtering beam are not perfect to enable precision in angles of incidence on a substrate. Thus, excess sputtered metal forms at the top of the opening, such that the geometry of the metallized opening does not generally match the geometry of the underlying opening in the substrate.

There is a need to maintain adequate alloy bottom step coverage of contact holes and to decrease contact area resistance to prevent device failure. There is a further need to control the composition of such alloys, without significant consumption of silicon from the bottom of the contact hole.

SUMMARY OF THE INVENTION

A recess feature is defined by an upper and a lower surface. An alloy is deposited in a recess feature of a semiconductor substrate by sputtering an alloy or composite target onto the semiconductor substrate to form a layer of deposited material on the upper surface. After a period of time, a negative bias voltage is applied to the substrate, initiating a resputtering scheme, which operates simultaneously with the sputtering step. The layer of deposited material is resputtered, to redeposit the layer of deposited material onto the lower surface as a first layer of resputtered material having a different stoichiometry than that of the deposited material. The resulting recess has improved bottom step coverage, which results in improved ohmic contacts.

Use of physical vapor deposition (PVD) to deposit alloys solves the problem of silicon depletion of shallow source/drain junction depths, as experienced using multiple-step, prior art techniques of siliciding source/drain regions by depositing a metal and annealing to form a silicide. In such prior art techniques, silicon is consumed from underlying source/drain regions, in a ratio of two atoms of silicon per atom of deposited titanium, to react with the deposited metal to form a silicide. Silicon is not over consumed from shallow junctions in this invention because the sputter-deposited titanium silicide already contains a significant portion of silicon. Subsequent chemical reactions, which deplete silicon in source/drain regions, are not needed to form the silicide. Furthermore, using PVD eliminates the problems associated with contamination introduced into the deposited film when using chemical vapor deposition (CVD).

In this invention, titanium silicide is deposited from an alloy or composite target into a high-aspect ratio contact hole. When the target material comprises titanium silicide, the ratio of silicon to titanium in the titanium silicide is approximately between 2.0:1 to 2.7:1, or another ratio, if required. Higher ratios of silicon to titanium are used when greater thermal stability is required, as when numerous subsequent heat cycles are needed to form a device. A target is used with a ratio of silicon to titanium equal to, or greater than that of any deposited or resputtered layer. However, as the desired stoichiometry of the resputtered material layers increasingly deviates from the stoichiometry of the target used, it becomes more difficult to make large stoichiometry changes between the target and resputtered layers. Therefore, a target is selected that has a stoichiometry which does not differ from that of resputtered layers to such an extent that it is impossible to obtain the desired stoichiometry in the resputtered layers.

The layer of deposited material has a ratio of silicon to titanium of between approximately 1.0:1 and 2.0:1. However, a ratio of 1.8:1 provides an optimum proportion of titanium, which reduces native oxides. When using a ratio of 1.8:1, very little silicon is consumed from the underlying substrate. By depositing a titanium-rich silicide film in the bottom corners of a contact hole, native oxides are reduced during a subsequent anneal step, decreasing the resistivity of the contact. A negative-bias voltage is applied to the substrate to form this resputtered layer, through low energy resputtering, using a low, grazing angle of incidence on the side of the material overhang, within the contact hole.

A low energy (low negative bias voltage) resputtering regime is defined in an area when the low energy is not larger than the lowest sputtering threshold energy of any constituent of an alloy or composite target. Typically, the threshold energy of a constituent is four times as much as its heat of sublimation. In this regime, resputtering yield increases dramatically with decreasing angle of ion incidence.

A low grazing angle also increases resputtering yield. Large angle resputtering is insignificant. Small angle or grazing angle resputtering is so dominant that a significant portion of resputtered material can reach the bottom corners of the contact hole. This reduces the doming effect, which arises when sputter depositing material (even with a collimated or long throw process), using conventional PVD processes. Reducing the doming effect improves bottom step coverage by making it more uniform.

Also, in this low energy, low grazing angle resputtering regime, in general, heavier elements of a sputtered species sputter at a faster rate than lighter elements. The substrate bias voltage is adjusted to achieve a desired resputtered material stoichiometry, according to the mass of the elements present in the sputtered alloy, or composite. In general, small changes (e.g. 10%) of stoichiometry are much easier to achieve using this low negative bias method. For instance, a 10% change of $TiSi_x$, X=2.0, stoichiometry gives rise to x=1.8, which is titanium-rich silicide, optimum for reducing native oxide on a silicon substrate surface.

In one embodiment of the invention, a collimated PVD setup is used to obtain a low grazing angle during resputtering. In a second embodiment of the invention, a long-throw process is used to obtain a low, grazing angle during resputtering. A long-throw throw process utilizes a non-collimated PVD apparatus. During a long-throw process, spacing between a target and substrate is so large that only a portion of target material, having a small trajectory angle, with respect to the normal direction of the target, can reach the bottom of a contact hole. Note that in the case of resputtering material overhang, the normal direction of the target (material overhang) is measured, extending radially into the contact hole, in the plane of the substrate. The resulting material deposition rate and bottom step coverage are improved using this embodiment, due to the low energy and low angle mechanisms described previously.

In a further embodiment of the invention, a sputtering chamber ambient atmosphere comprises argon and a nitrogen concentration of between approximately 0.1 to 3.0 percent by volume. Furthermore, in yet another embodiment of the invention, the resputtering step is followed by resputtering of at least one layer of material with a different stoichiometry than that of the first resputtered material layer, to form a "graded" stoichiometry of material deposited in the contact hole. Using a nitrogen ambient increases the ion-to-neutral ratio, which increases the resputtering rate. Therefore, the resulting material deposition rate and bottom step coverage are improved using this embodiment.

BRIEF DESCRIPTION OF THE DRAWING

FIG. 1b is a cross-sectional representation illustrating the material overhang portion of the system shown in FIG. 1a.

DETAILED DESCRIPTION

To improve alloy/composite bottom step coverage of a recess, such as a contact hole in a semiconductor substrate, material overhang is reduced at the "shoulder" of the contact opening and redistributed in the contact opening. Alloy/composite material overhang at the "shoulder" of contact openings is redistributed such that the redistributed material's stoichiometry is uniform and controlled, and such that remaining native oxides are reduced during a subsequent anneal step. The material is redistributed using a resputtering step. The redistributed material's stoichiometry is controlled, so that it is rich in titanium to provide for such reduction of native oxides.

Existing equipment, such as a Varian M2000 PVD apparatus, is utilized to accomplish better bottom step coverage. The invention does not require purchasing a new deposition system and training employees on how to use it, saving cost and time in fabricating contacts for semiconductor devices.

Figure 1A:
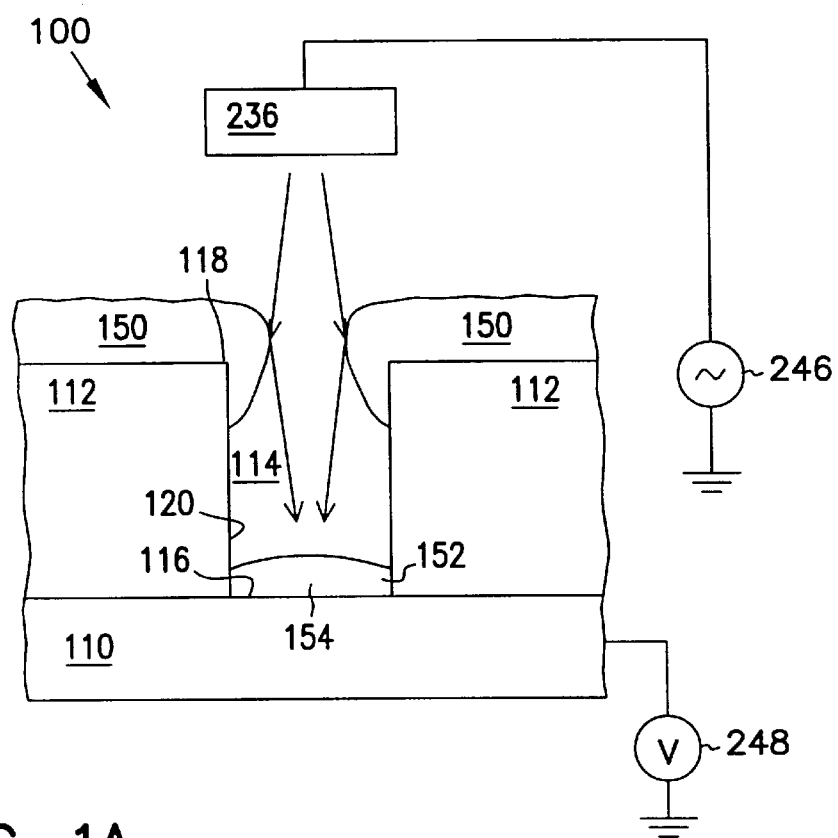
FIG. 1a is a cross-sectional representation illustrating a method for reducing material overhang on the upper surface of a recess.

FIG. 1a is a cross-sectional view of a semiconductor structure 100, comprising a portion of a substrate 110 on which an unrelated material 112 has been placed such that a recess 114 exists in material 112. Recess 114 is generally defined by a lower surface 116 (which is the upper exposed surface of the substrate 110), a top corner 118 (or upper surface), and a standing wall portion 120. In the case of a contact hole on a semiconductor substrate, the unrelated material 112 is typically an insulating material, such as an oxide, nitride, or borophosphosilicate glass (BPSG). An example of a high-aspect ratio contact hole is one having an approximately 20,000 angstrom thick layer 112 of BPSG formed on a silicon substrate 110, and having approximately a 0.5 micron opening 114. Thus, its aspect ratio is approximately 4.

Figure 2:
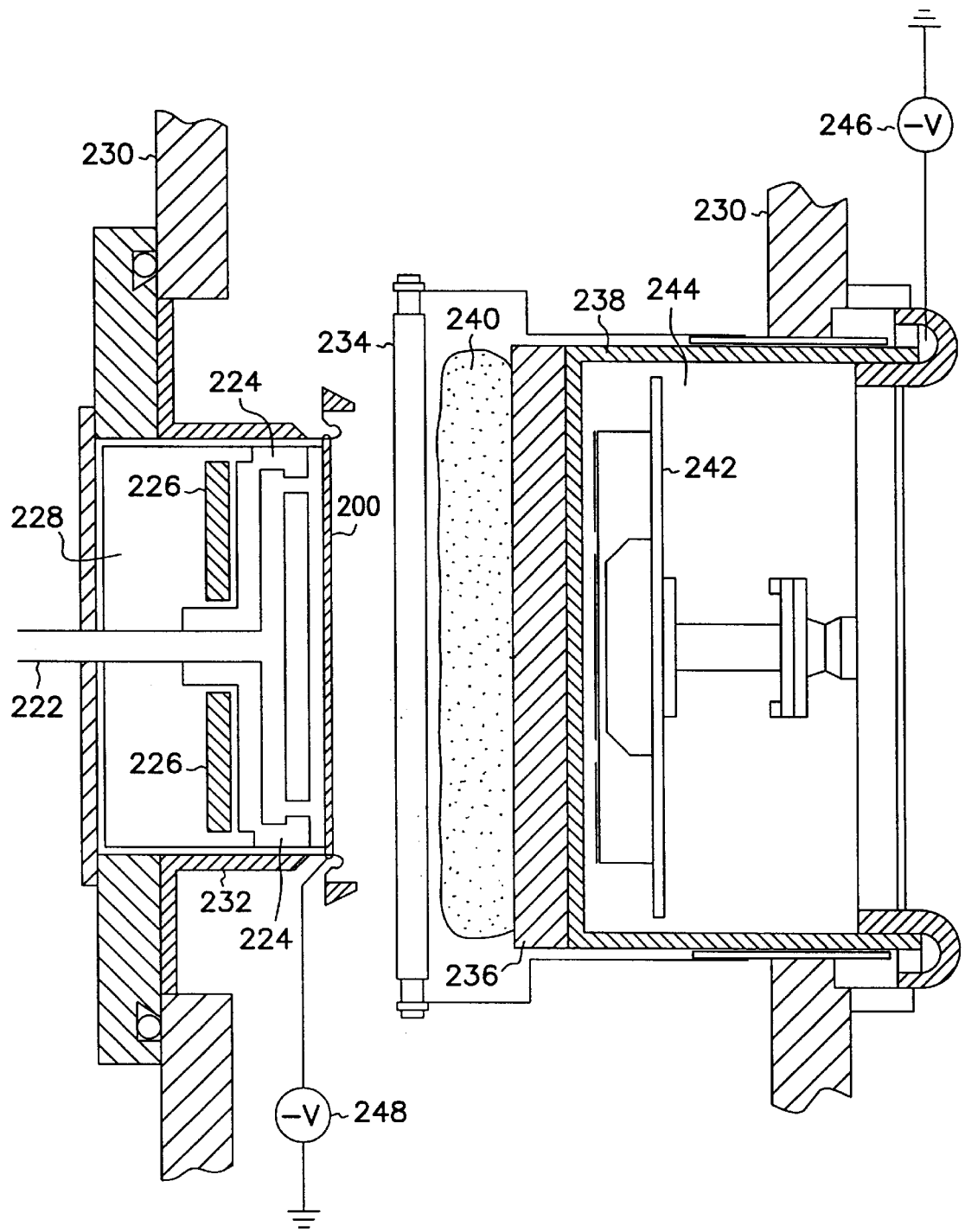
FIG. 2 is a schematic block diagram of a collimated sputtering apparatus, utilized in the present invention.

The semiconductor structure 100 is located within a sputtering system shown in FIG. 2 as 200. The system components comprise a back heating gas inlet 222 encased in a heater block 224, heater elements 226 and insulation 228 mounted to chamber walls 230, and chamber shields 232. Further components comprise a collimator 234, coupled between the semiconductor structure 200 and a target 236 and backing plate 238. A plasma 240 is created in the area between the collimator 234 and the target 236. Other components include a rotating magnet 242, encased in a water cooling system 244.

Target 236, as shown in FIG. 2, is comprised of an alloy, or composite, of a known stoichiometry. In this example, a standard target 236 is used, comprised of titanium silicide (TiSi$_2$) for siliciding a contact hole, but any suitable alloy or composite target may be used, and variations can be performed in the following process steps, without departing from the scope of the invention. For example, titanium silicide of the stoichiometry (TiSi$_x$) is another target material which may be used in this invention when the same target material is being used to deposit silicide layers on gates, where it is desired that the silicide be rich in silicon. The variable, x, is between approximately 2.0 to 2.7, or other variables if desired. Higher ratios of silicon to titanium are used when greater thermal stability is required, as when numerous subsequent heat cycles are needed to form a device. A target is used with a ratio of silicon to titanium equal to, or greater than that of any deposited layer or resputtered layer. However, as the desired stoichiometry of the deposited or resputtered material increasingly deviates from the stoichiometry of the target used, it becomes more difficult to make large stoichiometry changes between the target and deposited or resputtered layers. Therefore, a target is selected that has a stoichiometry, which does not differ from that of deposited or resputtered layers to such an extent that it is impossible to obtain the desired stoichiometry in the deposited or resputtered layer.

In a first embodiment of the invention, a Varian M2000 PVD tool, or similar equipment well known to one skilled in the art is used, as shown in FIG. 2. A Varian M2000 collimated titanium module setting is used, with a target 236 power applied at less than approximately 18 kW. Higher target power provides for a higher deposition rate. The target power is adjusted, so that the desired deposition rate is obtained. A typical argon flow rate is 25 sccm. A typical target-to-substrate spacing is approxmately 126 millimeters. The target-to-plasma spacing is adjusted, as is well known to one skilled in the art, depending on geometries and setup of the PVD tool used.

To initiate a sputtering regime, the target voltage induced may be either a direct current (DC) type, or a radio frequency (RF) type, from source 246, as shown in FIG. 2. The sputtered target atoms are deposited on a substrate 200, which either has a very small bias or zero bias applied directly to it from source 248. For a contact hole of aspect ratio 4, with a 0.5 micron opening, zero bias is preferred at this stage for the Varian M2000 setup. Note that a collimator is used in this setup. However, for contact holes with openings larger than 0.5 microns, a collimator is not always necessary.

A process window starts by introducing an inert gas, such as argon, from a gas inlet (not shown here), through region 222 and into the space between the target 236 and substrate 200 to form a plasma 240, and allowing it to stabilize (approximately 5 to 10 seconds), as shown in FIG. 2. Placing the gas under low, sub-atmospheric pressure creates the plasma (i.e., a mixture of positively charged gas ions and free electrons). A large negative voltage is then applied to the target 236, directing the plasma ions 240 to the target 236 and sputtering it, for a period of time, allowing a steady-state to be reached. This time depends on the aspect ratio of the hole and actual dimensions of the hole. For example, a contact hole of aspect ratio 4, with a 0.5 micron opening needs 5 seconds to reach this steady-state. However, a time frame of between approximately 0 to 25 seconds may be required, depending on geometries and setup of the PVD tool.

After a steady-state is reached, a steady-state resputter scheme is started to redistribute material 150 overhang at the top corner 118 (upper surface) to the bottom corners (on the lower surface) of the contact hole 152, as shown in Figure 1a. The resputtered material 154 at the bottom 116 of the contact hole 114 has a stoichiometry different than that of the material 150 at the top corner 118, due to the differential resputtering rates of the alloy/composite constituent elements. This resputter scheme is initiated by varying the substrate 110 bias from voltage source 248. For example, using the current setup and contact hole 114 of aspect ratio 4, the zero bias is switched to a small bias (−15 to −65 Volts). In general, the substrate bias voltage should be less than the lowest sputtering threshold energy of any constituent of the alloy target. Typically, the sputtering threshold energy of an element is four times its heat of sublimation. The amount of material 150 overhang is compensated with the amount of material 154 resputtered, providing a steady state process.

The elements in the target material alloy or composite resputter at different rates, due to their different atomic masses, resulting in material redistributed to the bottom of the contact hole, having a different stoichiometry than the deposited material at the top of the contact hole. In general, heavier elements of a sputtered species sputter at a faster rate than lighter elements. The substrate bias voltage is adjusted according to the elements present in the alloy, or composite, to obtain a layer of resputtered material, having a desired stoichiometry.

Figure 1B:
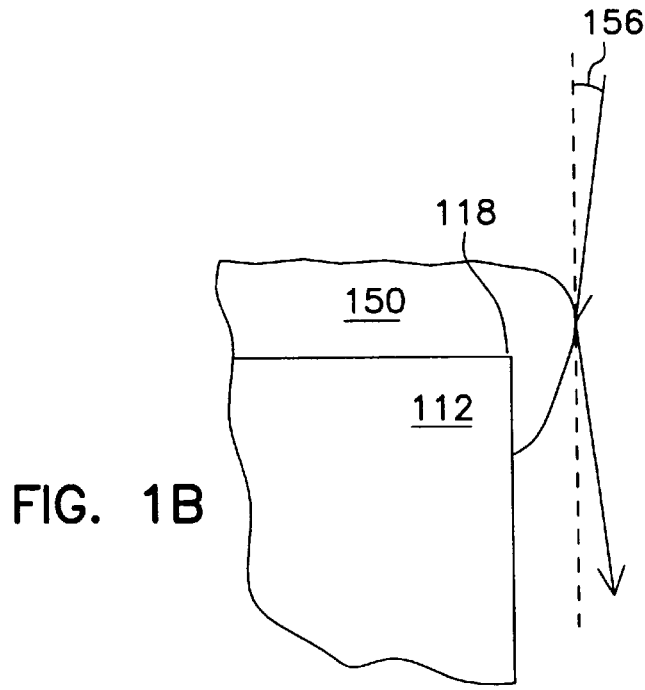

By utilizing a collimated PVD process, a low grazing angle 156 is obtained, as shown in FIG. 1b, with respect to the material 150 overhang, enabling resputtering in a preferential manner. Angles of between approximately 0 to 30 degrees are desired. Resputtering rate increases with decreasing angles of incidence, so adjustments are made to achieve a desired resputtering rate. During resputtering, target atoms hit the overhang material 150, causing the overhang material 150 to resputter to the bottom corners 152 of the contact hole 114. The low grazing angle 156 applied to the material 150 overhang, enables the resputtered material 154 to land on bottom corners 152 of the hole 114, areas which have frequently been hard to reach in the past. Resulting films of resputtered material are generally planar, due to this preferential resputtering in the corners, which inhibits the doming effect.

In addition, after a subsequent annealing step, such preferential resputtering further decreases the resistivity of the contact, and prevents degradation of device performance by reducing native oxides. The annealing step is performed in a furnace at temperatures of approximately 550 to 850 degrees Celsius, or by using rapid thermal processing (RTP) techniques. Corners of recesses are particularly adversely affected by the presence of remaining native oxides, which degrades device performance. Thus, depositing titanium-rich titanium silicide 154 in these corners 152, as shown in FIG. 1a, improves bottom step coverage and removes native oxides, due to titanium's ability to react with such oxides to reduce them to titanium oxide and titanium silicide. The oxide layer remains on top of the silicide layer after annealing, separated from the underlying silicon. Prior art techniques have not accomplished this preferential resputtering of titanium silicide to allow native oxide reduction in bottom corners of contact holes. Typically, titanium silicide having the stoichiometry of approximately $TiSi_{1.8}$ is adequate to effectively reduce remaining native oxide. In general, between 30 to 50 angstroms of titanium can reduce approximately 12 angstroms of native oxide. This enhances reliable low contact resistance and provides a low defect density at the silicide/silicon interface 116.

The exact details of the resputter scheme depend upon at least the type of device being manufactured (and, thus the particular electronic feature being fabricated), the aspect ratio of the hole, the depth (in absolute scale) of the hole, and the desired uniformity of the thin film. As for the lattermost factor, uniformities of single metal thin films deposited by conventional techniques are approximately 50% uniform, but it is believed that the uniformity of thin films produced by the process of this invention can approach as little as a 10–20% deviation from complete uniformity without significant effort, and possibly even as low as a 2% deviation after a significant effort to optimize the process window.

In a second embodiment of the invention, a long-throw PVD apparatus is used to obtain a low grazing angle during resputtering. A Varian M2000 PVD tool, or similar equipment well known to one skilled in the art, is used as shown in FIG. 2. However, in this embodiment, the apparatus is noncollimated because a collimator 234 is not used. Instead of using a collimator, a low grazing angle is obtained due to the large substrate-to-target distance. The target 236 power is applied at less than approximately 18 kW. Higher target power provides for a higher deposition rate. The target power is adjusted, so that the desired deposition rate is obtained. A typical argon flow rate is 25 sccm. The target-to-substrate spacing is approximately 450 millimeters. In general, the target-to-substrate spacing is approximately 2 to 3 times greater than that utilized in a collimated setup, and can range from between 100 to 1,000 millimeters, more or less, depending on the relative geometries of the PVD tool and substrate. The target-to-plasma spacing is adjusted, as is well known to one skilled in the art.

The voltage induced on the target 236, as shown in FIG. 2, may be either a direct current (DC) type or a radio frequency (RF) type, from source 246. The sputtered target atoms are deposited on a substrate 200, which either has a very small bias or zero bias applied directly to it from source 248. For a contact hole of aspect ratio 4, with a 0.5 micron opening, zero bias is preferred at this stage for the Varian M2000 setup. As noted for the previous embodiment, contact holes with openings wider than 0.5 microns do not always require such a large substrate-to-target spacing because collimation is not as critical for filling the hole.

After a steady-state is reached, a steady-state resputter scheme is started to redistribute material 150 overhang at the top corner 118 (upper surface) to the bottom corners (on the lower surface) of the contact hole 152, as shown in FIG. 1a. The resputtered material 154 on the lower surface 116 of the contact hole 114 has a stoichiometry different than that of the deposited material 150 at the top corner 118, due to the differential resputtering rates of the alloy/composite constituent elements. This resputter scheme is initiated by varying the substrate 110 bias from voltage source 248. For example, using the current setup and contact hole 114 of aspect ratio 4, the zero bias is switched to a small bias (−15 to −65 Volts). In general, the substrate bias voltage should be less than the lowest sputtering threshold energy of any constituent of the alloy target. The amount of material 150 overhang is compensated with the amount of material 154 resputtered, providing a steady state process. The elements in the target material alloy, or composite, resputter at different rates, due to their different atomic masses, resulting in resputtered material being redistributed to the bottom of the contact hole, having a different stoichiometry than the deposited material on the upper surface of the contact hole. In general, heavier elements of a sputtered species sputter at a faster rate than lighter elements. The bias voltage is adjusted according to the elements present in the alloy or composite.

By utilizing a long-throw PVD process, a low grazing angle 156 is obtained, as shown in FIG. 1b, with respect to the material 150 overhang, enabling resputtering in a preferential manner. Angles of between approximately 0 to 30 degrees are desired. Resputtering rate increases with decreasing angles of incidence, so adjustments are made to achieve a desired resputtering rate. During resputtering, target atoms hit the overhang material 150, causing the overhang material 150 to resputter to the bottom corners 152 (on the lower surface) of the contact hole 114. The low grazing angle 156 applied to the material 150 overhang enables the resputtered material 154 to land on bottom corners 152 of the hole 114, areas which have frequently been hard to reach in the past. Resulting films of resputtered material are generally planar, due to this preferential resputtering in the corners, which reduces the doming effect.

In addition, after a subsequent annealing step, such preferential resputtering decreases the resistivity of the contact, and prevents degradation of device performance by reducing native oxides. The annealing step is performed in a furnace at temperatures of approximately 550 to 850 degrees Celsius, or by using rapid thermal processing (RTP) techniques. Corners of recesses are particularly adversely affected by the presence of remaining native oxides, which degrades device performance. Thus, depositing titanium-rich titanium silicide 154 in these corners 152, as shown in FIG. 1a, improves bottom step coverage and removes native oxides, due to titanium's ability to react with such oxides to form titanium oxide and titanium silicide upon subsequent annealing of the material. The oxide layer remains on top of the silicide layer after annealing, separated from the underlying silicon. Prior art techniques have not accomplished this preferential resputtering of titanium silicide to allow native oxide reduction in bottom corners of contact holes. Typically, titanium silicide having the stoichiometry of approximately $TiSi_{1.8}$ is adequate to effectively reduce any remaining native oxide. Typically, between 30 to 50 angstroms of titanium can completely reduce 12 angstroms of native oxide. This enhances reliable low contact resistance and provides a low defect density at the silicide/silicon interface 116.

The exact details of the resputter scheme depend upon at least the type of device being manufactured (and, thus the particular electronic feature being fabricated), the aspect ratio of the hole, the depth (in absolute scale) of the hole, and the desired uniformity of the thin film. As for the lattermost factor, of single metal thin films deposited by conventional techniques are approximately 50% uniform, but it is believed that the uniformity of thin films produced by the process of this invention can approach as little as a 10–20% deviation from complete uniformity without significant effort, and possibly even as low as a 2% deviation after a significant effort to optimize the process window.

Figure 3A:
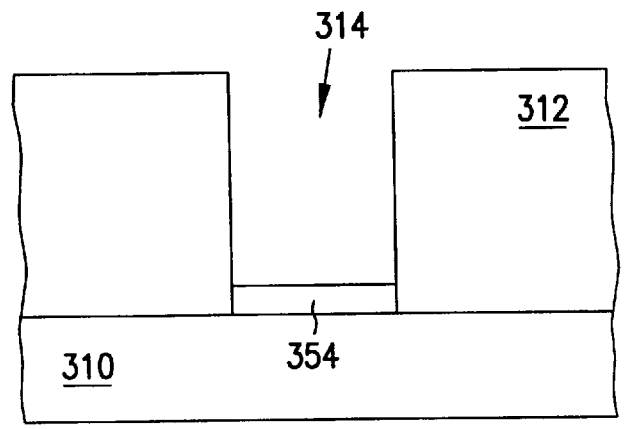
FIGS. 3a and 3b are a silicided contact hole formed in accordance with the method of the invention.

Subsequent to the resputter step, deposited material is selectively removed from areas of the substrate, outside of the contact hole 314, as is well known to one skilled in the art and shown in FIG. 3a. The resulting contact hole 314 is comprised of a silicon bottom 310, insulating material (such as oxides, nitrides, or BPSG) vertical sidewalls 312, and a layer of titanium silicide 354 coupled to the sidewalls 312 and formed with a minimal amount of silicon consumption from the substrate 310. Therefore, the substrate 310 is not depleted of silicon, to form the titanium silicide 354.

The maximum amount of silicon that is consumed from the substrate 310, as shown in FIG. 3a, is that needed to form titanium silicide in its equilibrium state. For example, titanium silicide has an equilibrium ratio of silicon to titanium of 2.0:1. When the resputtered material has a ratio of silicon to titanium of less than 2.0:1, silicon is consumed from the substrate to bring the ratio of silicon to titanium back to 2.0:1 after deposition. Compared to prior art techniques, since titanium silicide is being deposited instead of titanium, the profile of the substrate 310 does not change significantly during the process of forming a titanium silicide layer 354 thereon. The resulting layer of titanium silicide 354 provides lower contact resistance due to its generally planar shape. Although the resulting structure has been described in terms of a contact hole 314, deposited with titanium silicide 354, other types of materials and structures can be used, as described previously, without departing from the scope of the invention.

Figure 3B:
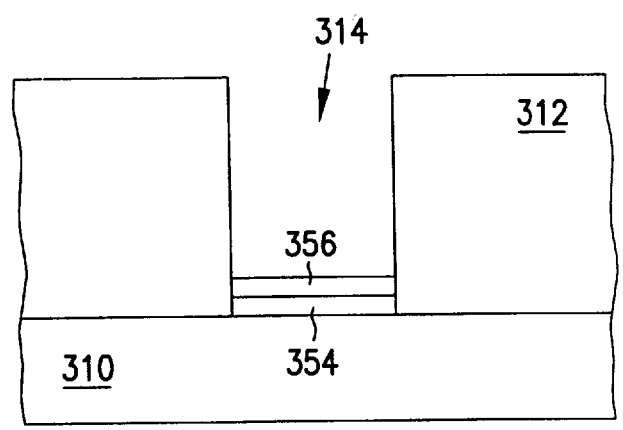

According to yet another aspect of the method of the present invention, once a desired amount of titanium-rich titanium silicide 154, as shown in FIG. 1a, is resputtered to the bottom 116 of the contact hole 114, the resputtering scheme is modified to fill on top of this resputtered layer 154. This aspect of the invention is applicable to either the first, or second, embodiment of the invention. For example, after formation of an initial resputtered layer 154, with a ratio of silicon to titanium of y1, a second layer of resputtered material, with a ratio of silicon to titanium of y2, is formed. This procedure can be repeated, if necessary, in a series of formation of layers (y1, y2, . . . , yn). In general, all of the (y1 . . . yn) values are different from each other. The values of the series are increased or decreased to provide a series of resputtered material layers resulting in a thin film with a "graded" stoichiometry (i.e., a variation in stoichiometry as a function of thin film depths). As shown in FIG. 3b, the resulting structure is comprised of a contact hole 314, having titanium silicide layers 354 and 356 with different stoichiometries. The resulting layers of titanium silicide 354 and 356 provide lower contact resistance due to their generally planar shape. Although the resulting structure has been described in terms of a contact hole 314, deposited with titanium silicide 354 and 356, other types of materials and structures can be used, as described previously, without departing from the scope of the invention.

Resputtering yield ratios between titanium and silicon from the titanium silicide overhang are varied by applying different biases to the substrate. The steady state resputtering step is divided into step 1, step 2, . . . , and step n, with corresponding substrate biases, $V_{s1}$, $V_{s2}$, . . ., and $V_{sn}$. For example, when using a resputtered layer of stoichiometry, $TiSi_{1.8}$, or smaller, for step 1, to reduce native oxide at the bottom surface of the contact hole, step 2 resputters a layer of stoichiometry, $TiSi_2$. Titanium silicide with a stoichiometry of $TiSi_2$ has the lowest resistivity of all titanium silicides, providing a low resistance contact. Furthermore, a stoichiometry of $TiSi_2$ prevents unnecessary diffusion of silicon from the substrate because it is the equilibrium state of titanium silicide and, thus, there is not a need for increasing the ratio of silicon to titanium in the titanium silicide.

In another embodiment, creating multiple layers of titanium silicides, with a stoichiometry, of $TiSi_x$, where x>2.0, improves high temperature stability of titanium silicide by approximately 50 to 150 degrees Celsius, depending on how high a value of x device manufacturing processes can tolerate. However, when desired layers of resputtered material comprise a ratio of silicon-to-titanium of greater than 2.0:1, the target material and layer of deposited material must have a ratio of silicon-to-titanium of at least as great as that of the largest ratio of silicon-to-titanium in the resputtered layers of material.

According to yet another embodiment of the method of the present invention, the method further comprises the steps of incorporating low concentrations of nitrogen within argon gas during deposition to modify the resputter yield. Utilizing any of the above embodiments, the nitrogen concentration introduced is between approximately 0.1 to 3.0 percent by volume of the total ambient. The addition of this nitrogen increases the ratio of ions to neutral atoms by 10% or more, which increases the resputtering rate. Note that the greatest improvement in this ratio would follow from introduction of oxygen instead of nitrogen, but the oxides that would form are not desirable. By introducing nitrogen, resulting silicide grains are finer (from 0.3 to 0.05 microns smaller), resputter yield is improved, and the agglomeration temperature at the silicide/silicon interface is increased to approximately 900 to 950 degrees Celsius. Increasing the agglomeration temperature alleviates problems with silicide failure at higher temperatures.

The invention described above is not meant to be read in a limiting sense. The inventive process is also applicable to depositing silicide films on trench capacitors of dynamic random access memory devices (DRAMs). Furthermore, the inventive process is not limited to depositions of titanium silicide, but encompasses a wide variety of other alloys. For example, $CoSi_x$, or other silicide composites, alloys used in any micromachining manufacturing processes with recess structures, and magnet alloys used in recess structures for data storage and data recordings can benefit from the method of the invention. The method of the invention can be applied to any PVD process in which stoichiometry of the deposited material must be precisely controlled, in a uniform or graded manner, to a composition different than that of other deposited areas on the film. In particular, high aspect ratio holes —aspect ratios of between approximately 3 to 7 significantly benefit from this invention.

What is claimed is:

1. A recess for a semiconductor device, comprising:

a recess bottom, comprised of a first material;

at least one vertical recess sidewall, comprised of a second material; and a generally planar layer of a third material, selected from the group consisting of alloys and composites and formed on the recess bottom.

2. The recess of claim 1, wherein the third material comprises a first layer of refractory metal silicide and the recess comprises a contact hole.

3. The recess of claim 2, further comprising a second layer of refractory metal silicide, formed on the first layer of refractory metal silicide, wherein the second layer of refractory metal silicide has a different stoichiometry than that of the first layer of refractory metal silicide.

4. The recess of claim 3, further comprising at least a third layer of refractory metal silicide, formed on the second layer of refractory metal silicide, wherein the third layer of refractory metal silicide has a different stoichiometry than that of at least the first and second layers of refractory metal silicide.

5. The recess of claim 1, wherein the first material comprises silicon, and the second material comprises an insulating material selected from the group consisting of oxides, nitrides and borophosphosilicate glass.

* * * * *